United States Patent
Namie et al.

(10) Patent No.: US 8,574,330 B2
(45) Date of Patent: Nov. 5, 2013

(54) CHEMICAL MECHANICAL POLISHING AQUEOUS DISPERSION AND CHEMICAL MECHANICAL POLISHING METHOD FOR SEMICONDUCTOR DEVICE

(75) Inventors: Yuuji Namie, Yokkaichi (JP); Tomohisa Konno, Yokkaichi (JP); Masayuki Motonari, Yokkaichi (JP); Hirotaka Shida, Yokkaichi (JP); Akihiro Takemura, Yokkaichi (JP)

(73) Assignee: JSR Corporation, Tokyo (JP)

( * ) Notice: Subject to any disclaimer, the term of this patent is extended or adjusted under 35 U.S.C. 154(b) by 915 days.

(21) Appl. No.: 12/297,949

(22) PCT Filed: Sep. 27, 2007

(86) PCT No.: PCT/JP2007/068803
§ 371 (c)(1),
(2), (4) Date: Jan. 7, 2009

(87) PCT Pub. No.: WO2008/044477
PCT Pub. Date: Apr. 17, 2008

(65) Prior Publication Data
US 2009/0221213 A1    Sep. 3, 2009

(30) Foreign Application Priority Data
Oct. 6, 2006   (JP) ................... 2006-275150

(51) Int. Cl.
*B24D 3/02* (2006.01)
*C09C 1/68* (2006.01)
*C09K 3/14* (2006.01)

(52) U.S. Cl.
USPC ............ 51/307; 451/36; 451/41; 451/66

(58) Field of Classification Search
USPC .............................. 451/36, 41, 66
See application file for complete search history.

(56) References Cited

U.S. PATENT DOCUMENTS

| | | |
|---|---|---|
| 6,443,812 B1 | 9/2002 | Costas et al. |
| 6,607,424 B1 | 8/2003 | Costas et al. |
| 2003/0153183 A1 | 8/2003 | Konno et al. |

(Continued)

FOREIGN PATENT DOCUMENTS

| | | |
|---|---|---|
| CN | 1434491 A | 8/2003 |
| CN | 1822325 A | 8/2006 |

(Continued)

OTHER PUBLICATIONS

Extended European Search Report issued Nov. 9, 2010, in Patent Application No. 07828549.1.

(Continued)

*Primary Examiner* — Kaj K Olsen
*Assistant Examiner* — Ross J Christie
(74) *Attorney, Agent, or Firm* — Oblon, Spivak, McClelland, Maier & Neustadt, L.L.P.

(57) ABSTRACT

A chemical mechanical polishing aqueous dispersion of the invention includes (A) a first water-soluble polymer having a weight average molecular weight of 500,000 to 2,000,000 and including a heterocyclic ring in its molecule, (B) a second water-soluble polymer or its salt having a weight average molecular weight of 1000 to 10,000 and including one group selected from a carboxyl group and a sulfonic group, (C) an oxidizing agent, and (D) abrasive grains, and has a pH of 7 to 12.

14 Claims, 2 Drawing Sheets

(56) References Cited

U.S. PATENT DOCUMENTS

| | | |
|---|---|---|
| 2005/0136670 A1 | 6/2005 | Ameen et al. |
| 2005/0194562 A1 | 9/2005 | Lavoie, Jr. et al. |
| 2006/0096179 A1 | 5/2006 | Lu et al. |
| 2006/0138086 A1 | 6/2006 | Lane et al. |
| 2006/0143990 A1 | 7/2006 | Ono et al. |
| 2006/0163530 A1 | 7/2006 | Liu |
| 2006/0186089 A1 | 8/2006 | Shida et al. |
| 2006/0201914 A1 | 9/2006 | Uchikura et al. |
| 2006/0276041 A1 | 12/2006 | Uchikura et al. |
| 2007/0049180 A1* | 3/2007 | Shida et al. ............. 451/41 |
| 2009/0117829 A1 | 5/2009 | Ono et al. |

FOREIGN PATENT DOCUMENTS

| | | | |
|---|---|---|---|
| JP | 2002155268 A | * | 5/2002 |
| JP | 2002 517593 | | 6/2002 |
| JP | 2002 270549 | | 9/2002 |
| JP | 2003 282494 | | 10/2003 |
| JP | 2005 217395 | | 8/2005 |
| JP | 2005 244229 | | 9/2005 |
| TW | 200630471 | | 9/2006 |
| WO | 01 14496 | | 3/2001 |
| WO | 01 17006 | | 3/2001 |
| WO | WO 2004/111157 A1 | | 12/2004 |

OTHER PUBLICATIONS

U.S. Appl. No. 12/127,334, filed May 27, 2008, Kunitani, et al.
U.S. Appl. No. 12/097,361, filed Jun. 13, 2008, Ikeda, et al.
U.S. Appl. No. 12/295,673, filed Oct. 1, 2008, Uchikura, et al.
U.S. Appl. No. 12/295,872, filed Oct. 3, 2008, Takemura, et al.
U.S. Appl. No. 12/537,766, filed Aug. 7, 2009, Abe, et al.
U.S. Appl. No. 12/529,545, filed Sep. 2, 2009, Matsumoto, et al.
U.S. Appl. No. 12/676,272, filed Mar. 3, 2010, Takemura, et al.
U.S. Appl. No. 12/749,934, filed Mar. 30, 2010, Shida, et al.
U.S. Appl. No. 12/467,729, filed May 18, 2009, Kunitani, et al.
U.S. Appl. No. 12/866,571, filed Aug. 6, 2010, Shida, et al.
U.S. Appl. No. 12/918,013, filed Aug. 17, 2010, Shida, et al.
U.S. Appl. No. 12/867,954, filed Aug. 17, 2010, Motonari, et al.
U.S. Appl. No. 12/919,897, filed Aug. 27, 2010, Nishimoto, et al.
U.S. Appl. No. 12/374,074, filed Jan. 16, 2009, Andou, et al.

* cited by examiner

Prior Art

CHEMICAL MECHANICAL POLISHING AQUEOUS DISPERSION AND CHEMICAL MECHANICAL POLISHING METHOD FOR SEMICONDUCTOR DEVICE

TECHNICAL FIELD

The present invention relates to a chemical mechanical polishing aqueous dispersion suitably used when producing a semiconductor device, and a chemical mechanical polishing method using the chemical mechanical polishing aqueous dispersion.

BACKGROUND ART

In recent years, interconnects formed in semiconductor devices have been increasingly scaled down along with an increase in the degree of integration (density) of semiconductor devices. A damascene method has been known as technology capable of scaling down interconnects. In the damascene method, grooves or the like formed in an insulating layer are filled with an interconnect material, and an unnecessary interconnect material deposited in an area other than the grooves is removed by chemical mechanical polishing to form desired interconnects. When using copper or a copper alloy as an interconnect material, a high-strength, high-dielectric-constant insulating layer (barrier layer) is generally formed of tantalum, tantalum nitride, titanium nitride, or the like at the interface between copper or a copper alloy and the insulating material in order to prevent migration of copper atoms into the insulating layer.

When using the damascene method in the production of semiconductor devices using copper or a copper alloy as an interconnect material, chemical mechanical polishing is performed in various ways. As the chemical mechanical polishing method, two-stage chemical mechanical polishing may be performed which includes a first polishing step of mainly removing copper or a copper alloy and a second polishing step of mainly removing the barrier layer.

Since interconnects formed in semiconductor devices have been scaled down, the first polishing step is required to polish copper at a rate of 800 nm/min substantially without polishing the barrier layer and control copper dishing to 20 nm or less. When using a low-dielectric-constant material (low-k material) for an insulating layer, since delamination or layer breakage occurs when friction occurs to a large extent during polishing, it is difficult to apply a chemical mechanical polishing aqueous dispersion which causes friction to occur to a large extent during polishing.

The second polishing step is required to polish the polishing target surface with low friction in the same manner as in the first polishing step to improve the hydrophilicity of the polishing target surface and an abrasive cloth, thereby reducing copper scratches, copper corrosion, and insulating layer scratches while reducing copper dishing and insulating layer erosion.

In order to satisfy the above-mentioned demands for the first polishing step and the second polishing step, various chemical mechanical polishing aqueous dispersions using a water-soluble polymer such as polyvinylpyrrolidone have been proposed.

For example, JP-A-2003-282494 discloses a chemical mechanical polishing aqueous dispersion containing a polyoxo acid or its salt, a water-soluble polymer, and water. JP-A-2003-282494 describes that the chemical mechanical polishing aqueous dispersion reduces defects (e.g., scratches and dishing) of the polishing target surface.

JP-A-2002-270549 discloses adding polyvinylpyrrolidone as a dispersant for abrasive grains contained in a chemical mechanical polishing aqueous dispersion.

JP-A-2002-517593 discloses a chemical mechanical polishing aqueous dispersion containing water, abrasive grains, an oxidizing agent, and an organic polymer. JP-A-2002-517593 describes that the organic polymer may be polyvinylpyrrolidone. JP-A-2002-517593 describes that the chemical mechanical polishing aqueous dispersion reduces the polishing rate using the abrasive grains.

Specifically, the above-mentioned patent documents add a water-soluble polymer such as polyvinylpyrrolidone to the chemical mechanical polishing aqueous dispersion aimed at causing the water-soluble polymer to adhere to the abrasive grains or the polishing target surface to improve the dispersibility of the abrasive grains or reduce the polishing rate for the polishing target surface.

When using such a water-soluble polymer, the dispersibility of the abrasive grains can be improved, and the polishing rate for the polishing target surface can be reduced. On the other hand, since the water-soluble polymer also adheres to the polishing target area, the polishing rate decreases to a large extent, whereby incomplete copper removal or the like occurs.

DISCLOSURE OF THE INVENTION

The invention aims at eliminating a phenomenon referred to as a fang in addition to the above-mentioned problems. The term "fang" used herein refers to a phenomenon which tends to occur when a metal layer is formed of copper or a copper alloy. Specifically, the term "fang" refers to a groove-shaped defect which occurs in a semiconductor device due to chemical mechanical polishing at the interface between an area including minute copper or copper alloy interconnects and an area (field area) other than the copper or copper alloy interconnects.

Specifically, when a component contained in a chemical mechanical polishing aqueous dispersion is non-uniformly accumulated at the interface between an area including minute copper or copper alloy interconnects and an area (field area) other than the copper or copper alloy interconnects, an area around the interface may be polished to a large extent, whereby a fang may occur. For example, when abrasive grains contained in a chemical mechanical polishing aqueous dispersion are present at a high concentration near the interface between an area including minute copper or copper alloy interconnects and an area (field area) other than the copper or copper alloy interconnects, the polishing rate locally increases at the interface, whereby an area around the interface may be polished to a large extent. This phenomenon is observed as a spike-shaped defect. This spike-shaped defect is referred to as a fang.

A fang occurs in various ways depending on the wiring pattern. The cause of a fang is described in detail below using a polishing target 100 shown in FIGS. 1A to 1C as an example.

As shown in FIG. 1A, the polishing target 100 has a configuration including an insulating layer 12 in which interconnect depressions 20 (e.g., grooves) are formed, a barrier layer 14 provided to cover the surface of the insulating layer 12 and the bottom and the inner wall surface of the interconnect depressions 20, and a copper or copper alloy layer 16 which is provided in the interconnect depressions 20 and is formed on the barrier layer 14, these layers being stacked on a substrate 10. The polishing target 100 includes an area 22 in which minute copper or copper alloy interconnects are formed, and an area 24 in which minute copper or copper alloy interconnects are not formed. A copper or copper alloy depression tends to be formed in the area 22 in which minute interconnects are formed.

FIG. 1B shows a state after the copper or the copper alloy layer 16 has been subjected to chemical mechanical polishing. When subjecting the copper or the copper alloy layer 16 to chemical mechanical polishing, a minute scratch 30 may occur at the interface between the area 22 in which minute copper or copper alloy interconnects are formed and the area 24 in which minute copper or copper alloy interconnects are not formed.

FIG. 1C shows a state after the copper or the copper alloy layer 16 has been subjected to chemical mechanical polishing until the barrier layer 14 is observed. In this state, the minute scratch 30 has been enlarged to a groove-shaped fang 32.

As a result of studies, the inventors of the invention consider that such a fang occurs for the following reason.

In FIG. 1B, since the barrier layer 14 is positively charged and the abrasive grains 28 are negatively charged, the abrasive grains 28 are localized in the minute scratch 30 due to an electrostatic interaction. When performing chemical mechanical polishing in a state in which the abrasive grains 28 are localized in the minute scratch 30, the minute scratch 30 is polished to a large extent, whereby the fang 32 occurs.

Such a fang may adversely affect the resulting semiconductor device and may decrease yield.

An object of the invention is to provide a chemical mechanical polishing aqueous dispersion that can uniformly and stably polish a copper or copper alloy layer with low friction without causing incomplete copper removal while reducing copper dishing, copper corrosion, insulating layer erosion, and a fang.

A chemical mechanical polishing aqueous dispersion according to the invention comprises:

(A) a first water-soluble polymer having a weight average molecular weight of 500,000 to 2,000,000, a molecule of the first water-soluble polymer including a heterocyclic ring;

(B) a second water-soluble polymer or a salt of the second water-soluble polymer having a weight average molecular weight of 1000 to 10,000 and including one group selected from a carboxyl group and a sulfonic group;

(C) an oxidizing agent; and (D) abrasive grains, the chemical mechanical polishing aqueous dispersion having a pH of 7 to 12.

In the chemical mechanical polishing aqueous dispersion according to the invention, a mass ratio (A)/(B) of the first water-soluble polymer (A) and the second water-soluble polymer (B) may be 0.02 to 50.

In the chemical mechanical polishing aqueous dispersion according to the invention, a 5 mass % aqueous solution of the first water-soluble polymer (A) may have a viscosity of 50 to 150 mPa·s.

In the chemical mechanical polishing aqueous dispersion according to the invention, a 5 mass % aqueous solution of the second water-soluble polymer (B) may have a viscosity of 1 to 5 mPa·s.

In the chemical mechanical polishing aqueous dispersion according to the invention, the first water-soluble polymer (A) may be a copolymer having at least one structural unit derived from a compound selected from vinylpyridine, vinylpyrrolidone, and vinylimidazole.

In the chemical mechanical polishing aqueous dispersion according to the invention, the second water-soluble polymer (B) may be a copolymer having at least one structural unit derived from a compound selected from acrylic acid, methacrylic acid, itaconic acid, maleic acid, styrenesulfonic acid, allylsulfonic acid, vinylsulphonic acid, and salts thereof.

The chemical mechanical polishing aqueous dispersion according to the invention may further comprise (E) a complex-forming agent and (F) a surfactant.

A chemical mechanical polishing method for a semiconductor device according to the invention comprises polishing a copper or copper alloy layer on a semiconductor substrate by using the above-described chemical mechanical polishing aqueous dispersion.

The chemical mechanical polishing aqueous dispersion according to the invention is characterized in that the chemical mechanical polishing aqueous dispersion includes the first water-soluble polymer (A) having a weight average molecular weight of 500,000 to 2,000,000 and including a heterocyclic ring in its molecule, and the second water-soluble polymer or its salt (B) having a weight average molecular weight of 1000 to 10,000 and including one group selected from a carboxyl group and a sulfonic group.

It is possible to reduce copper dishing, copper corrosion, insulating layer erosion, and a fang by adding the first water-soluble polymer to the chemical mechanical polishing aqueous dispersion. On the other hand, since the polishing rate for the polishing target surface decreases by adding the first water-soluble polymer, a further polishing time is required to obtain a desired polished surface. Moreover, since the polishing performance of the chemical mechanical polishing aqueous dispersion has decreased due to the addition of the first water-soluble polymer, unnecessary copper may remain.

Therefore, the second water-soluble polymer or its salt is added to the chemical mechanical polishing aqueous dispersion. This enables the polishing rate which has decreased due to the addition of the first water-soluble polymer to be recovered while reducing copper dishing, copper corrosion, insulating layer erosion, and a fang. Moreover, copper which remains due to a decrease in polishing performance of the chemical mechanical polishing aqueous dispersion can be removed by adding the second water-soluble polymer.

The inventors of the invention confirmed that a fang may easily occur when (a) the polishing target metal layer is a copper or copper alloy layer and (b) the oxidizing agent contained in the chemical mechanical polishing aqueous dispersion is hydrogen peroxide.

BEST MODE FOR CARRYING OUT THE INVENTION

Figure 1A:
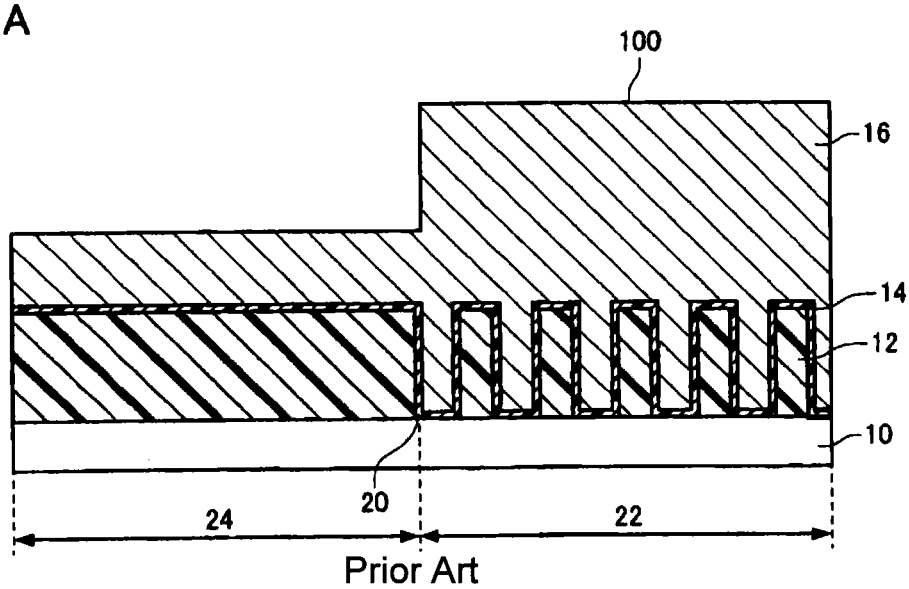
FIG. 1A is a cross-sectional view showing a mechanism by which a fang occurs during chemical mechanical polishing used when producing a semiconductor device.
Figure 1B:
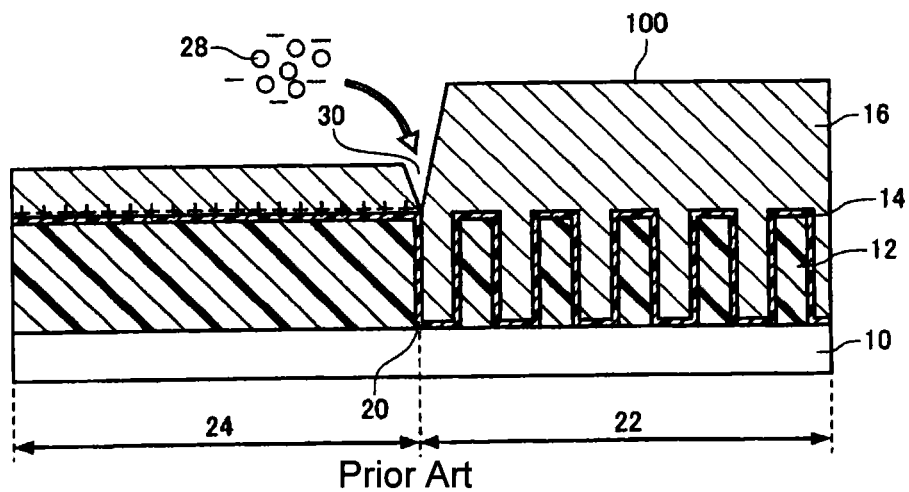
FIG. 1B is another cross-sectional view showing a mechanism by which a fang occurs during chemical mechanical polishing used when producing a semiconductor device.
Figure 1C:
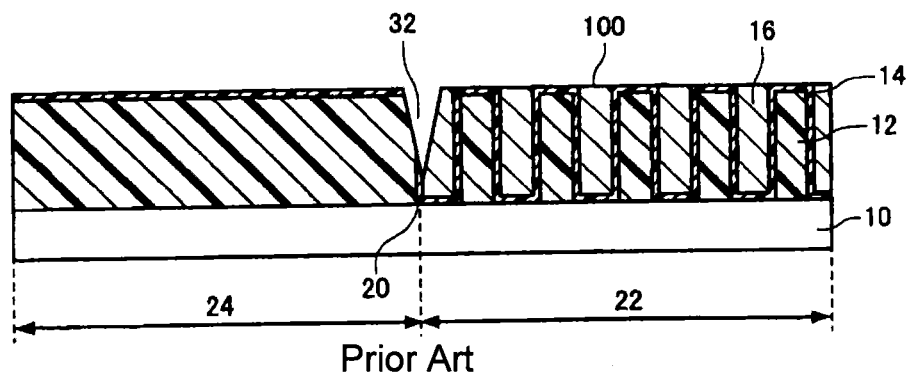
FIG. 1C is a further cross-sectional view showing a mechanism by which a fang occurs during chemical mechanical polishing used when producing a semiconductor device.

Embodiments of the invention are described below with reference to the drawings.

1. CHEMICAL MECHANICAL POLISHING AQUEOUS DISPERSION

A chemical mechanical polishing aqueous dispersion according to the present invention includes (A) a first water-soluble polymer having a weight average molecular weight of 500,000 to 2,000,000 and including a heterocyclic ring in its molecule, (B) a second water-soluble polymer or its salt having a weight average molecular weight of 1000 to 10,000 and including one group selected from a carboxyl group and a sulfonic group, (C) an oxidizing agent, and (D) abrasive grains, and has a pH of 7 to 12. The chemical mechanical polishing aqueous dispersion may optionally include (E) a complex-forming agent, (F) a surfactant, and other components insofar as the effects of the invention are not impaired.

The details of each component of the chemical mechanical polishing aqueous dispersion according to one embodiment of the invention are given below.

1.1 (A) First Water-Soluble Polymer

The chemical mechanical polishing aqueous dispersion according to this embodiment can reduce copper dishing and copper corrosion due to the first water-soluble polymer having a weight average molecular weight of 500,000 to 2,000,000 and including a heterocyclic ring in its molecule. The first water-soluble polymer has relatively high affinity to copper due to the heterocyclic ring included in its molecule. The first water-soluble polymer adheres to the surface of copper to reduce friction during polishing and effectively protect copper interconnects during polishing. Moreover, the first water-soluble polymer moderately increases the viscosity of the chemical mechanical polishing aqueous dispersion, thereby reducing a fang (i.e., a scratch with a non-uniform shape) which may occur at the edge of a minute interconnect.

Examples of the first water-soluble polymer which may exhibit the above-mentioned effects include a copolymer having at least one structural unit derived from a compound selected from vinylpyridine, vinylpyrrolidone, and vinylimidazole.

The first water-soluble polymer may preferably have a sodium polystyrenesulfonate-reduced weight average molecular weight determined by gel permeation chromatography (solvent: water) of 500,000 to 2,000,000, more preferably 500,000 to 1,500,000, and particularly preferably 700,000 to 1,500,000. If the first water-soluble polymer has a weight average molecular weight within the above range, friction during polishing can be reduced so that copper dishing and copper corrosion can be reduced. Moreover, a copper or copper alloy layer can be stably polished. If the weight average molecular weight of the first water-soluble polymer is less than 500,000, a fang may occur. If the weight average molecular weight of the first water-soluble polymer is too high, an appropriate polishing rate may not be achieved, whereby unnecessary copper may remain. Moreover, the abrasive grains may aggregate in a slurry supply device and increase the number of scratches produced on copper.

The first water-soluble polymer is preferably used in an amount of 0.005 to 1 mass %, more preferably 0.01 to 0.5 mass %, and particularly preferably 0.01 to 0.2 mass % based on the mass of the chemical mechanical polishing aqueous dispersion. If the first water-soluble polymer is used in an amount of less than 0.005 mass %, friction during polishing may not be reduced so that the temperature of abrasive cloth may increase. As a result, a phenomenon in which polishing stops (CMP stop) may occur depending on the components of the slurry. Moreover, copper may not be effectively removed from a copper over-plated area. If the first water-soluble polymer is used in an amount of more than 1 mass %, the polishing rate for a copper or copper alloy layer may decrease. Moreover, the slurry may not be stably supplied to an abrasive cloth due to an increase in the viscosity of the chemical mechanical polishing aqueous dispersion. As result, an increase in the temperature of the abrasive cloth, polishing non-uniformity (deterioration in in-plane uniformity), and the like may occur, whereby the polishing rate or dishing may vary. It is preferable that the chemical mechanical polishing aqueous dispersion have a viscosity of less than 2 mPa·s in order to prevent the above-mentioned problems.

The chemical mechanical polishing aqueous dispersion according to this embodiment may be suitably used for chemical mechanical polishing which polishes an interconnect metal (e.g., copper or copper alloy) until a barrier layer is exposed (hereinafter may be referred to as "first polishing"). If the content of the first water-soluble polymer is within the above range, friction can be reduced while achieving a high polishing rate when chemically and mechanically polishing a copper or copper alloy layer. Moreover, since the polishing rate for the barrier layer can be reduced, the barrier layer can be allowed to remain. It is also possible to reduce copper dishing and insulating layer erosion while reducing copper corrosion, copper scratches, and the like. Moreover, since copper in a copper over-plated area can be advantageously polished, polishing stability and polishing rate uniformity can be improved.

The viscosity of the first water-soluble polymer is defined using a 5 mass % aqueous solution. The viscosity of a 5 mass % aqueous solution of the first water-soluble polymer measured at 25° C. using a BM-type rotational viscometer is preferably 50 to 150 mPa·s, more preferably 50 to 120 mPa·s, and particularly preferably 60 to 100 mPa·s. If the first water-soluble polymer has a viscosity within the above range, friction during polishing can be reduced so that a fang can be reduced. If the viscosity of a 5 mass % aqueous solution of the first water-soluble polymer is less than 50 mPa·s, friction during polishing may not be sufficiently reduced so that a fang may occur. If the viscosity of a 5 mass % aqueous solution of the first water-soluble polymer is more than 150 mPa·s, the viscosity of the chemical mechanical polishing aqueous dispersion increases, whereby a mechanical polishing force decreases so that copper may remain. It is preferable that the chemical mechanical polishing aqueous dispersion have a viscosity of less than 2 mPa·s, as described above. Since the viscosity of the chemical mechanical polishing aqueous dispersion according to this embodiment is mainly determined by the weight average molecular weight and the content of the first water-soluble polymer, the viscosity of the chemical mechanical polishing aqueous dispersion may be adjusted within the above-mentioned range by taking the balance between the weight average molecular weight and the content of the first water-soluble polymer into consideration.

The first water-soluble polymer may be used individually, or two or more first water-soluble polymers which differ in weight average molecular weight may be used in combination insofar as the weight average molecular weight or the viscosity of a 5 mass % aqueous solution is within the above-mentioned range.

1.2 (B) Second Water-Soluble Polymer

The chemical mechanical polishing aqueous dispersion according to this embodiment may cause a decrease in polishing rate or incomplete copper removal due to the addition of the first water-soluble polymer. Such a problem may occur when the first water-soluble polymer protects the polishing target surface to a large extent. Such a problem can be eliminated by adding the second water-soluble polymer.

The chemical mechanical polishing aqueous dispersion according to this embodiment includes the second water-soluble polymer or its salt having a weight average molecular weight of 1000 to 10,000 and including one group selected from a carboxyl group and a sulfonic group in addition to the first water-soluble polymer. This eliminates the above-mentioned problem caused by the addition of the first water-soluble polymer while reducing copper dishing, copper corrosion, insulating layer erosion, and a fang.

Specifically, while the first water-soluble polymer is positively charged to a small extent, the second water-soluble polymer is negatively charged. A situation in which the first water-soluble polymer adheres to the surface of copper to a large extent can be reduced by adding the negatively charged second water-soluble polymer so that a decrease in polishing rate, incomplete copper removal, and the like can be prevented.

Moreover, since the first water-soluble polymer is positively charged and the second water-soluble polymer negatively charged, a network of the water-soluble polymers can be formed in the aqueous dispersion. This makes it possible to effectively provide the aqueous dispersion with a moderate viscosity while buffering contact between the abrasive grains and the surface of copper.

Examples of the second water-soluble polymer which may exhibit the above-mentioned effects include a copolymer having at least one structural unit derived from a compound selected from acrylic acid, methacrylic acid, itaconic acid, maleic acid, styrenesulfonic acid, allylsulfonic acid, vinylsulphonic acid, and salts thereof.

The second water-soluble polymer may have a sodium polystyrenesulfonate-reduced weight average molecular weight determined by gel permeation chromatography (solvent: water) of 1000 to 10,000. If the second water-soluble polymer has a weight average molecular weight within the above-mentioned range, the polishing rate for a copper or copper alloy layer which has decreased due to the addition of the first water-soluble polymer can be recovered. If the weight average molecular weight of the second water-soluble polymer is more than 10,000, a large number of scratches may occur on the surface of copper due to interaction with the abrasive grains. If the weight average molecular weight of the second water-soluble polymer is less than 1000, the polishing rate for a copper or copper alloy layer which has decreased due to the addition of the first water-soluble polymer may not be sufficiently recovered, whereby unnecessary copper may remain.

The second water-soluble polymer is preferably used in an amount of 0.005 to 1 mass %, more preferably 0.01 to 0.5 mass %, and particularly preferably 0.01 to 0.2 mass % based on the mass of the chemical mechanical polishing aqueous dispersion. If the content of the second water-soluble polymer is less than 0.005 mass %, the polishing rate for a copper or copper alloy layer which has decreased due to the addition of the first water-soluble polymer may not be sufficiently recovered, whereby unnecessary copper may remain. If the content of the second water-soluble polymer is more than 1 mass %, dishing and erosion due to copper etching may increase since the second water-soluble polymer unnecessarily exhibits its function.

When using the chemical mechanical polishing aqueous dispersion according to this embodiment for the above-mentioned first polishing, if the content of the second water-soluble polymer is within the above range, friction can be reduced while achieving a high polishing rate when chemically and mechanically polishing a copper or copper alloy layer. Moreover, since the polishing rate for the barrier layer can be reduced, the barrier layer can be allowed to remain. It is also possible to reduce copper dishing and insulating layer erosion while reducing copper corrosion and copper scratches. Moreover, since copper in a copper over-plated area can be advantageously polished, polishing stability and polishing rate uniformity can be improved.

The viscosity of the second water-soluble polymer is defined using a 5 mass % aqueous solution. The viscosity of a 5 mass % aqueous solution of the second water-soluble polymer measured using a BM-type rotational viscometer is preferably 1 to 5 mPa·s, more preferably 1 to 3 mPa·s, and particularly preferably 1 to 2 mPa·s. If the viscosity of a 5 mass % aqueous solution of the second water-soluble polymer is within the above range, copper interconnects can be effectively etched so that incomplete copper removal does not occur. If the viscosity of a 1 mass % aqueous solution of the second water-soluble polymer is more than 5 mPa·s, the abrasive grains may aggregate due to interaction between the second water-soluble polymer and the abrasive grains. As a result, scratches on copper interconnects may occur.

In this embodiment, the mass ratio (A)/(B) of the first water-soluble polymer (A) and the second water-soluble polymer (B) included in the chemical mechanical polishing aqueous dispersion may be specified. The mass ratio (A)/(B) is preferably 0.02 to 50, more preferably 0.05 to 20, and particularly preferably 0.1 to 10. If the mass ratio (A)/(B) is less than 0.02, friction during polishing may not be sufficiently reduced so that a fang may occur. Moreover, copper dishing or insulating layer erosion may occur to a large extent. If the mass ratio (A)/(B) is more than 50, the polishing force may not be sufficiently recovered with respect to an increase in the viscosity of the chemical mechanical polishing aqueous dispersion, whereby copper may remain.

The second water-soluble polymer may be used individually, or two or more second water-soluble polymers which differ in weight average molecular weight may be used in combination insofar as the weight average molecular weight or the viscosity of a 5 mass % aqueous solution is within the above-mentioned range.

1.3 (C) Oxidizing Agent

Examples of the oxidizing agent used in the chemical mechanical polishing aqueous dispersion according to this embodiment include ammonium persulfate, potassium persulfate, hydrogen peroxide, ferric nitrate, cerium diammonium nitrate, iron sulfate, ozone, potassium periodate, and the like. These oxidizing agents may be used either individually or in combination.

In particular, ammonium persulfate, potassium persulfate, and hydrogen peroxide are preferable from the viewpoint of oxidizing performance, compatibility with a protective film, handling capability, and the like.

The oxidizing agent is preferably used in an amount of 0.03 to 5 mass %, and more preferably 0.05 to 3 mass % based on the mass of the chemical mechanical polishing aqueous dispersion. If the content of the oxidizing agent is less than 0.03 mass %, a copper or copper alloy layer may not be sufficiently oxidized, whereby the polishing rate may decrease. If the content of the oxidizing agent is more than 5 mass %, corrosion of a copper or copper alloy layer or copper dishing may occur to a large extent.

1.4 (D) Abrasive Grains

As the abrasive grains used in the chemical mechanical polishing aqueous dispersion according to this embodiment, inorganic particles or organic-inorganic composite particles are preferable. Examples of the inorganic particles include fumed silica, fumed alumina, and fumed titania synthesized by reacting silicon chloride, aluminum chloride, titanium chloride, or the like with oxygen and hydrogen in a gas phase using a fuming method; silica synthesized by subjecting a metal alkoxide to hydrolysis and condensation using a sol-gel method; high-purity colloidal silica which is synthesized by an inorganic colloid method or the like and from which impurities are removed by purification; and the like.

The type and the configuration of the organic-inorganic composite particles are not particularly limited insofar as inorganic particles and organic particles as mentioned above are integrally formed in such a manner that the inorganic particles and the organic particles are not easily separated during polishing. Examples of the organic-inorganic composite particles include composite particles obtained by subjecting an alkoxysilane, an aluminum alkoxide, a titanium alkoxide, or the like to polycondensation in the presence of polymer particles (e.g., polystyrene or polymethyl methacrylate) so that a polycondensate (e.g., polysiloxane, polyaluminoxane, or polytitanoxane) is formed on at least the surface of the polymer particle. The polycondensate may be directly bonded to a functional group of the polymer particle, or may be indirectly bonded to a functional group of the polymer particle through a silane coupling agent or the like.

The organic-inorganic composite particles may be formed using the above-mentioned polymer particles and silica particles, alumina particles, titania particles, or the like. In this case, the composite particles may be formed so that silica particles or the like are present on the surface of the polymer particles using a polycondensate (e.g., polysiloxane, polyaluminoxane, or polytitanoxane) as a binder, or may be formed so that functional groups (e.g., hydroxyl group) of silica particles or the like and functional groups of the polymer particles are chemically bonded.

As the organic-inorganic composite particles, composite particles in which organic particles and inorganic particles having zeta potentials of opposite polarities (positive or negative) are bonded by an electrostatic force in an aqueous dispersion containing these particles.

The zeta potential of organic particles is generally negative over the entire pH range or a wide pH range excluding a low pH range. When organic particles have a carboxyl group, a sulfonic acid group, or the like, the organic particles more reliably have a negative zeta potential. When organic particles have an amino group or the like, the organic particles have a positive zeta potential in a specific pH range.

The zeta potential of inorganic particles has high pH dependence. Inorganic particles have an isoelectric point at which the zeta potential is zero, and the polarity of the zeta potential is reversed across the isoelectric point.

Therefore, when mixing specific organic particles and inorganic particles in a pH range in which the organic particles and the inorganic particles have zeta potentials of opposite polarities, the organic particles and the inorganic particles are bonded by an electrostatic force to form composite particles. Even if the organic particles and the inorganic particles have zeta potentials of the same polarity when mixed, the organic particles and the inorganic particles may be bonded by reversing the polarity of the zeta potential of one of the particles (particularly inorganic particles) by changing the pH of the mixture.

A polycondensate (e.g., polysiloxane, polyaluminoxane, or polytitanoxane) may be formed on at least the surface of the composite particles integrated by an electrostatic force by subjecting an alkoxysilane, an aluminum alkoxide, a titanium alkoxide, or the like to polycondensation in the presence of the composite particles.

The average particle diameter of the abrasive grains is preferably 5 to 1000 nm. The average particle diameter of the abrasive grains may be measured using a laser scattering diffraction measuring instrument or observation using a transmission electron microscope. If the average particle diameter of the abrasive grains is less than 5 nm, a chemical mechanical polishing aqueous dispersion which achieves a sufficiently high polishing rate may not be obtained. If the average particle diameter of the abrasive grains is more than 1000 nm, dishing and erosion may not be reduced sufficiently. Moreover, a stable aqueous dispersion may not be obtained due to precipitation/separation of the abrasive grains. The average particle diameter of the abrasive grains is more preferably 10 to 700 nm, and particularly preferably 15 to 500 nm. If the average particle diameter of the abrasive grains is within the above range, a stable chemical mechanical polishing aqueous dispersion which achieves a high polishing rate, sufficiently reduces dishing and erosion, and rarely shows precipitation/separation of the abrasive grains can be obtained.

When metal ions (e.g., iron ions, nickel ions, or zinc ions) remain in a semiconductor device subjected to chemical mechanical polishing, yield may decrease. In the invention, it is preferable that the abrasive grains contain these metal ions in an amount of 10 ppm or less, preferably 5 ppm or less, more preferably 3 ppm or less, and particularly preferably 1 ppm or less. Note that it is most preferable that the abrasive grains do not contain these metal ions.

The abrasive grains are preferably used in an amount of 0.01 to 5 mass %, and more preferably 0.02 to 4 mass % based on the mass of the chemical mechanical polishing aqueous dispersion. If the content of the abrasive grains is less than 0.01 mass %, a sufficient polishing rate may not be achieved. If the content of the abrasive grains is more than 5 mass %, cost may increase. Moreover, a stable chemical mechanical polishing aqueous dispersion may not be obtained.

1.5 (E) Complex-Forming Agent

Examples of the complex-forming agent used in the chemical mechanical polishing aqueous dispersion according to this embodiment include a complex-forming agent that forms a water-insoluble complex and a complex-forming agent that forms a water-soluble complex. The term "water-insoluble" used herein means that a substance is not substantially dissolved in water, and includes the case where the wet etching rate in the presence of the oxidizing agent is less than 3 nm/min. The term "water-soluble" includes the case where the wet etching rate is 3 nm/min or more.

The complex-forming agent that forms a water-insoluble complex and the complex-forming agent that forms a water-soluble complex may be used either individually or in combination.

The complex-forming agent is preferably used in an amount of 0.0005 to 4 mass %, and more preferably 0.05 to 2 mass % based on the mass of the chemical mechanical polishing aqueous dispersion. If the content of the complex-forming agent is less than 0.0005 mass %, it may be difficult to reduce copper dishing to 20 nm or less. If the content of the complex-forming agent is more than 4 mass %, the polishing rate may decrease.

1.5.1 Complex-Forming Agent that Forms Water-Insoluble Complex

Examples of the complex-forming agent that forms a water-insoluble or water-scarcely-soluble complex with a metal such as copper include heterocyclic compounds having a heterocyclic six-membered ring or a heterocyclic five-membered ring containing at least one nitrogen atom. Specific examples of such heterocyclic compounds include quinaldic acid, quinolinic acid, benzotriazole, benzimidazole, 7-hydroxy-5-methyl-1,3,4-triazaindolizine, nicotinic acid, picolinic acid, and the like.

An anionic surfactant may be used as the complex-forming agent that forms a water-insoluble complex. As such an anionic surfactant, an alkylbenzenesulfonate is preferable. Examples of the alkylbenzenesulfonate include potassium dodecylbenzenesulfonate, ammonium dodecylbenzenesulfonate, and the like.

The complex-forming agent that forms a water-insoluble complex is preferably used in an amount of 0.0005 to 2 mass %, and more preferably 0.075 to 1.5 mass % based on the mass of the chemical mechanical polishing aqueous dispersion. If the content of the complex-forming agent that forms a water-insoluble complex is less than 0.0005 mass %, copper dishing may occur to a large extent. If the content of the complex-forming agent that forms a water-insoluble complex is more than 2 mass %, a sufficient copper polishing rate may not be achieved.

1.5.2 Complex-Forming Agent that Forms Water-Soluble Complex

The complex-forming agent that forms a water-soluble complex serves as a polishing accelerating agent. Examples of the complex-forming agent that forms a water-soluble complex include amino acids such as glycine, alanine, and tryptophan, and the like. It is also effective to use an organic acid having a similar effect. Examples of such an organic acid include formic acid, lactic acid, acetic acid, tartaric acid, fumaric acid, glycolic acid, phthalic acid, maleic acid, oxalic acid, citric acid, malic acid, malonic acid, glutaric acid, and the like. A basic salt such as ammonia, ethylenediamine, or tetramethylammonium hydroxide (TMAH) may also be used.

The complex-forming agent that forms a water-soluble complex is preferably used in an amount of 0.0005 to 2 mass %, and more preferably 0.075 to 1.5 mass % based on the mass of the chemical mechanical polishing aqueous dispersion, although the amount varies depending on the type of metal. If the content of the complex-forming agent that forms a water-soluble complex is less than 0005 mass %, copper may not be polished at a sufficient polishing rate. If the content of the complex-forming agent that forms a water-soluble complex is more than 2 mass %, copper dishing or corrosion may occur to a large extent.

1.6 (F) Surfactant

A nonionic surfactant, an anionic surfactant, or a cationic surfactant may be added to the chemical mechanical polishing aqueous dispersion according to this embodiment, as required.

Examples of the nonionic surfactant include nonionic surfactants having a triple bond. Specific examples of the nonionic surfactant include acetylenic glycol, an ethylene oxide adduct of acetylenic glycol, acetylene alcohol, and the like. A silicone surfactant, polyvinyl alcohol, cyclodextrin, polyvinyl methyl ether, hydroxyethylcellulose, or the like may also be used.

Examples of the anionic surfactant include an aliphatic soap, a sulfate salt, a phosphate salt, and the like.

Examples of the cationic surfactant include an aliphatic amine salt, an aliphatic ammonium salt, and the like.

These surfactants may be used either individually or in combination. It is preferable to use a nonionic surfactant having a weight average molecular weight lower than that of the first water-soluble polymer. When using a compound having a high molecular weight other than the first water-soluble polymer, the polishing rate may decrease to a large extent, or dishing may occur to a large extent.

The surfactant is preferably used in an amount of 0.001 to 0.5 mass %, and more preferably 0.05 to 0.3 mass % based on the mass of the chemical mechanical polishing aqueous dispersion. If the content of the surfactant is within the above range, copper dishing can be sufficiently reduced.

1.7 Other Components

The chemical mechanical polishing aqueous dispersion according to this embodiment may include a pH adjusting agent, an anti-corrosion agent, and the like, as required.

1.7.1 pH Adjusting Agent

Examples of the pH adjusting agent include an organic base, an inorganic base, and an inorganic acid. Examples of the organic base include tetramethylammonium hydroxide, triethylamine, and the like. Examples of the inorganic base include ammonia, potassium hydroxide, sodium hydroxide, calcium hydroxide, magnesium hydroxide, and the like. Examples of the inorganic acid include nitric acid, sulfuric acid, hydrochloric acid, acetic acid, and the like.

The pH of the chemical mechanical polishing aqueous dispersion according to this embodiment is not particularly limited. The pH of the chemical mechanical polishing aqueous dispersion according to this embodiment may be adjusted using the pH adjusting agent. The inventors of the invention confirmed that a fang easily occurs in an alkali region. However, since the above-described chemical mechanical polishing aqueous dispersion can reduce a fang, the chemical mechanical polishing aqueous dispersion can be suitably used in an alkali region (pH: 7 to 12).

The pH adjusting agent is preferably used in an amount of 0.005 to 5 mass %, and more preferably 0.01 to 3.5 mass % based on the mass of the chemical mechanical polishing aqueous dispersion.

1.7.2 Anti-Corrosion Agent

Examples of the anti-corrosion agent include benzotriazole and benzotriazole derivatives. The term "benzotriazole derivative" used herein refers to a compound obtained by replacing at least one hydrogen atom of benzotriazole by a carboxyl group, a methyl group, an amino group, a hydroxyl group, or the like. Examples of the benzotriazole derivative include 4-carboxybenzotriazole and its salts, 7-carboxybenzotriazole and its salts, benzotriazole butyl ester, 1-hydroxymethylbenzotriazole, 1-hydroxybenzotriazole, and the like.

The anti-corrosion agent is preferably used in an amount of 0.005 to 0.1 mass %, and more preferably 0.01 to 0.05 mass % based on the mass of the chemical mechanical polishing aqueous dispersion.

2. CHEMICAL MECHANICAL POLISHING METHOD AND SEMICONDUCTOR DEVICE PRODUCTION METHOD

A chemical mechanical polishing method and a semiconductor device production method according to the invention are described in detail below with reference to the drawings.

2.1 First Specific Example

2.1.1 Polishing Target

Figure 2:
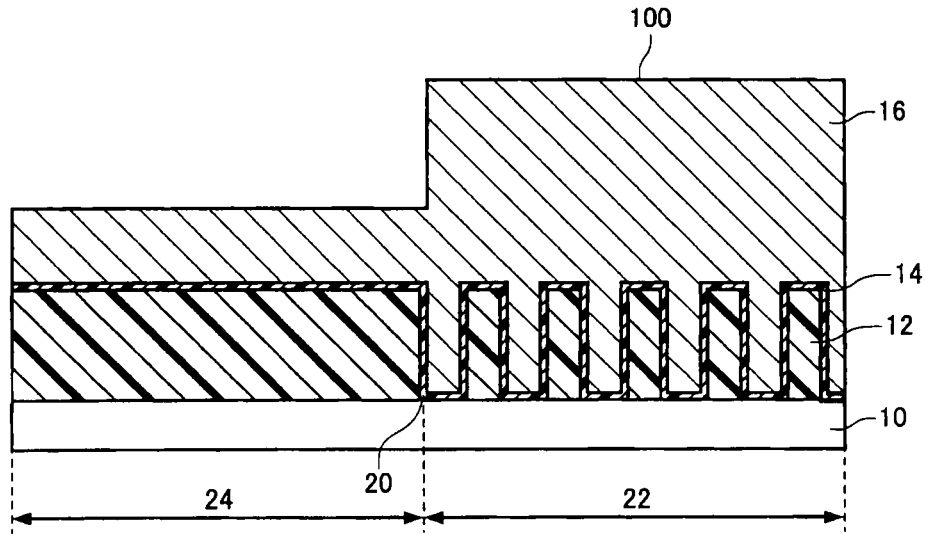
FIG. 2 is a cross-sectional view schematically showing a semiconductor device before chemical mechanical polishing in a method of producing a semiconductor device according to one embodiment of the invention.

FIG. 2 shows a polishing target 100 of the chemical mechanical polishing method according to a first specific example. FIG. 2 shows a polishing target which is the same as that shown in FIG. 1A. The material for each layer and the like are also described below.

An insulating layer 12 formed of silicon oxide is provided on a substrate 10 on which semiconductor elements (not shown) are formed. An interconnect depression 20 is formed by etching the insulating layer 12. The insulating layer 12 may be a PETEOS layer, an insulating layer having a relative dielectric constant of 3.5 or less, or the like. The insulating layer 12 is preferably an insulating layer having a relative dielectric constant of 3.5 or less, and more preferably 3.0 or less.

A barrier layer 14 is formed to cover the surface of the insulating layer 12 and the bottom and the inner wall surface of the interconnect depression 20. The barrier layer 14 may be formed of tantalum, tantalum nitride, or the like.

The interconnect depression 20 is filled with copper or a copper alloy, and copper or a copper alloy is provided on the barrier layer 14. The polishing target 100 includes an area 22 in which minute copper or copper alloy interconnects are formed, and an area 24 in which minute copper or copper alloy interconnects are not formed. A copper or copper alloy depression tends to be formed in the area 22 in which minute interconnects are formed.

2.1.2 First Polishing

Figure 3:
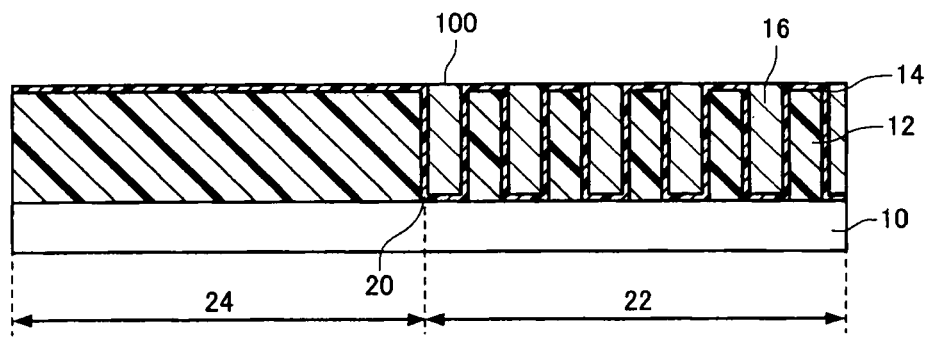
FIG. 3 is a cross-sectional view schematically showing a semiconductor device after chemical mechanical polishing in a method of producing a semiconductor device according to one embodiment of the invention.

FIG. 3 is a cross-sectional view showing the polishing target 100 after first polishing. In the first polishing step, a layer 16 formed of copper or a copper alloy in an area other than the area provided in the interconnect depression 20 is subjected to chemical mechanical polishing using the above-described chemical mechanical polishing aqueous dispersion until the surface of the barrier layer 14 is exposed. In the first polishing step, a chemical mechanical polishing apparatus shown in FIG. 4 may be used.

Figure 4:
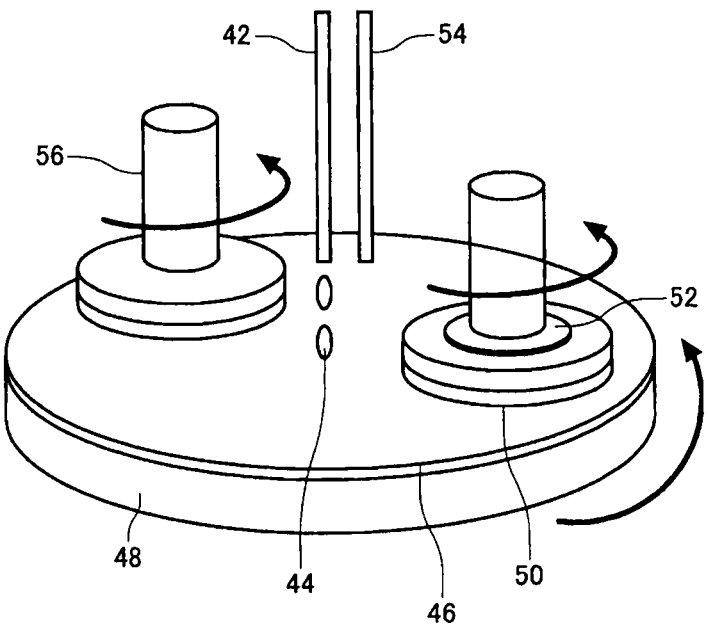
FIG. 4 is a schematic view showing part of a chemical mechanical polishing apparatus.

FIG. 4 is a schematic view showing a chemical mechanical polishing apparatus. As shown in FIG. 4, the polishing target 100 is subjected to chemical mechanical polishing by bringing a top ring 52 that holds a semiconductor substrate 50 in contact with an abrasive cloth 46 while supplying a chemical mechanical polishing aqueous dispersion (slurry 44) from a slurry supply nozzle 42 and rotating a turntable 48 to which the abrasive cloth 46 is attached. FIG. 4 also shows a water supply nozzle 54 and a dresser 56.

The polishing load applied by the top ring 52 may be selected within the range of 10 to 1000 gf/cm² (0.98 to 98 kPa) (preferably 30 to 500 gf/cm² (2.94 to 49 kPa)). The rotational speed of the turntable 48 and the top ring 52 may be appropriately selected within the range of 10 to 400 rpm (preferably 30 to 150 rpm). The flow rate of the slurry 44 supplied from the slurry supply nozzle 42 may be selected within the range of 10 to 1000 cm³/min (preferably 50 to 400 cm³/min).

A semiconductor device shown in FIG. 3 having excellent flatness without incomplete copper removal can be obtained by the first polishing step while reducing copper dishing, copper corrosion, insulating layer erosion, and a fang.

3. EXAMPLES

The invention is described below by way of examples. Note that the invention is not limited to the following examples.

3.1 Preparation of Chemical Mechanical Polishing Aqueous Dispersion

A plastic container was charged with ion-exchanged water, 0.2 mass % of colloidal silica (manufactured by Fuso Chemical Co., Ltd., primary particle diameter: 30 nm) (abrasive grains), 0.2 mass % and 0.3 mass % of quinaldic acid and glycine, respectively (complex-forming agent), 0.1 mass % of potassium dodecylbenzenesulfonate (surfactant), hydrogen peroxide in an amount corresponding to 0.1 mass % (oxidizing agent), and first and second water-soluble polymers in amounts corresponding to each of Examples 1 to 9 shown in Table 1. After adjusting the pH of the mixture to about 9.3 by adding an appropriate amount of ammonia, the mixture was stirred for 15 minutes, and then filtered through a filter having a pore diameter of 5 micrometers to obtain a chemical mechanical polishing aqueous dispersion. Hydrogen peroxide was added to the chemical mechanical polishing aqueous dispersion as an oxidizing agent immediately before chemical mechanical polishing in an amount of 0.1 mass % based on the total mass of the chemical mechanical polishing aqueous dispersion. The chemical mechanical polishing aqueous dispersion was sufficiently stirred before use. The properties (e.g., pH and viscosity) of the chemical mechanical polishing aqueous dispersion are shown in Table 1.

3.2 Evaluation of Polishing Performance

A polishing pad made of porous polyurethane ("IC1010" manufactured by Rohm and Haas Electric Materials) was installed in a chemical mechanical polishing system ("Mirra" manufactured by Applied Materials). Chemical mechanical polishing was performed while supplying the chemical mechanical polishing aqueous dispersion prepared in "3.1 Preparation of chemical mechanical polishing aqueous dispersion".

3.2.1 Polishing Conditions

The chemical mechanical polishing conditions were as follows.
Head rotational speed: 120 rpm
Head load: 1.5 psi (10.3 kPa)
Table rotational speed: 120 rpm
Chemical mechanical polishing aqueous dispersion supply rate: 200 cm³/min

3.2.2 Calculation of Copper Polishing Rate

A product in which a copper film with a thickness of 1500 nm was formed on an eight-inch silicon substrate with a thermal oxide film was subjected to chemical mechanical polishing for one minute under the conditions described in "3.2.1 Polishing conditions". The thickness of the copper film was measured before and after chemical mechanical polishing using an electric conduction-type thickness meter ("OmniMap RS75" manufactured by KLA-Tencor Corporation). The polishing rate was calculated from the thicknesses before and after chemical mechanical polishing and the polishing time. The results are shown in Table 2.

3.2.3 Polishing Test for Patterned Substrate

A patterned wafer ("SEMATECH 854" manufactured by SEMATECH INTERNATIONAL) was used as the polishing target. A period of time from the start of polishing to an end point detected by infrared rays emitted from a table was determined to be an endpoint time. The polishing time was set at a value 1.2 times the endpoint time. The wafer was subjected to chemical mechanical polishing under the conditions described in "3.2.1 Polishing conditions". Incomplete copper removal, dishing, erosion, a fang, and scratches were evaluated by the following methods.

3.2.3a Evaluation of Incomplete Copper Removal

A minute interconnect area (line/space=0.18 micrometers/ 0.18 micrometers) and a non-interconnect area (field area) of the polished wafer were observed using an optical microscope ("MX-50" manufactured by Olympus Corporation). A case where incomplete copper removal was not observed was evaluated as "Good", and a case where incomplete copper removal was observed was evaluated as "Bad". The results are shown in Table 2.

3.2.3b Evaluation of Dishing

The amount of dishing of a copper interconnect with a width of 100 micrometers in an area in which a pattern having a copper interconnect area with a width of 100 micrometers and an insulating area with a width of 100 micrometers that were alternately provided, was continuously formed to a length of 3.0 mm in the direction perpendicular to the longitudinal direction was measured using a precise step meter ("HRP-240" manufactured by KLA-Tencor Corporation). The results are shown in Table 2. A case where the amount of dishing was 50 nm or less was evaluated as "Good".

3.2.3c Evaluation of Erosion

The amount of erosion of the center of an interconnect with respect to the ends in an area in which a pattern having a copper interconnect area with a width of 9 micrometers and an insulating area with a width of 1 micrometer that were alternately provided, was continuously formed to a length of 1.25 mm in the longitudinal direction was measured using a precise step meter ("HRP-240" manufactured by KLA-Tencor Corporation). The amount of erosion is referred to as Re. The results are shown in Table 2. A case where the amount of erosion was 50 nm or less was evaluated as "Good".

3.2.3d Evaluation of Fang

The amount of depression of the ends of a copper interconnect in an area in which a pattern having a copper interconnect area with a width of 9 micrometers and an insulating area with a width of 1 micrometer that were alternately provided, was continuously formed to a length of 1.25 mm in the longitudinal direction was measured using a precise step meter ("HRP-240" manufactured by KLA-Tencor Corporation). The amount of depression is referred to as Rf. A case where the amount of depression Rf was smaller than the amount of erosion Re was evaluated as "Good", and a case where the amount of depression Rf was larger than the amount of erosion Re was evaluated as "Bad". The results are shown in Table 2.

3.2.3e Evaluation of Scratches 200 unit areas (120×120 micrometers) in a copper interconnect area were observed at random in a dark field using an optical microscope, and the number of unit areas in which scratches were observed was counted as the number of scratches. The results are shown in Table 2.

3.3 Comparative Examples 1 to 16

In Comparative Examples 1 to 7, polyvinylpyrrolidone was used as the first water-soluble polymer, and polyacrylic acid was used as the second water-soluble polymer.

In Comparative Examples 1 and 2, the weight average molecular weight of the first water-soluble polymer was too low.

In Comparative Examples 3 and 4, the weight average molecular weight of the first water-soluble polymer was too high.

In Comparative Example 5, the weight average molecular weight of the first water-soluble polymer was too low.

In Comparative Example 6, the weight average molecular weight of the second water-soluble polymer was too low.

In Comparative Examples 7 and 8, the weight average molecular weight of the second water-soluble polymer was too high.

In Comparative Example 9, a polyvinyl alcohol which did not contain a heterocyclic ring was used as the first water-soluble polymer.

In Comparative Example 10, an acrylamide-dimethylaminoethylacrylamide copolymer which did not contain a heterocyclic ring was used as the first water-soluble polymer.

In Comparative Example 11, the second water-soluble polymer was not used.

In Comparative Example 12, the first water-soluble polymer was not used.

In Comparative Example 13, hydroxyethylcellulose was used as the first water-soluble polymer, polymethacrylic acid was used as the second water-soluble polymer, and the weight average molecular weight of the second water-soluble polymer was too high.

In Comparative Example 14, polyphosphoric acid was used as the second water-soluble polymer, and the first water-soluble polymer was not used.

In Comparative Example 15, the first water-soluble polymer and the second water-soluble polymer were not used.

In Comparative Example 16, the pH of the chemical mechanical polishing aqueous dispersion was 5.2.

TABLE 1

| | First water-soluble polymer | | | | Second water-soluble polymer | | | | |
|---|---|---|---|---|---|---|---|---|---|
| | Type | Molecular weight | Concentration (mass %) | Viscosity of 5 mass % aqueous solution (mPa·s) | Type | Molecular weight | Concentration (mass %) | Viscosity of 5 mass % aqueous solution (mPa·s) | pH | Viscosity (mPa·s) |
| Example 1 | Polyvinylpyrrolidone | 500,000 | 0.10 | 60.5 | Polymethacrylic acid | 10,000 | 0.05 | 2.0 | 9.4 | 1.20 |
| Example 2 | Polyvinylpyrrolidone | 800,000 | 0.03 | 72.1 | Polyacrylic acid | 4,000 | 0.03 | 1.6 | 9.4 | 1.25 |
| Example 3 | Polyvinylpyrrolidone | 1,000,000 | 0.05 | 86.4 | Polyacrylic acid | 4,000 | 0.03 | 1.6 | 9.3 | 1.32 |
| Example 4 | Vinylpyrrolidone-acrylamide copolymer | 1,800,000 | 0.01 | | Polymethacrylic acid | 8,800 | 0.01 | | 9.5 | |
| Example 5 | Polyvinylpyridine | 520,000 | 0.01 | | Itaconic acid-acrylic acid copolymer | 1,600 | 0.02 | | 8.2 | |
| Example 6 | Vinylpyridine-vinyl acetate copolymer | 550,000 | 0.10 | | Sodium polystyrenesulfonate | 7,500 | 0.10 | | 10.5 | |
| Example 7 | Vinylpyrrolidone-vinylimidazole copolymer | 720,000 | 0.05 | | Maleic acid-methacrylic acid copolymer | 2,800 | 0.80 | | 10.1 | |
| Example 8 | Polyvinylcaprolactam | 550,000 | 0.15 | | Polymethacrylic acid | 9,200 | 0.50 | | 9.7 | |
| Example 9 | Polyvinylimidazole | 560,000 | 0.01 | | Poly-2-methylfumaric acid | 2,200 | 0.20 | | 8.5 | |
| Comparative Example 1 | Polyvinylpyrrolidone | 50,000 | 0.05 | 15.2 | Polyacrylic acid | 4,000 | 0.03 | 1.6 | 9.3 | 1.15 |
| Comparative Example 2 | Polyvinylpyrrolidone | 45,000 | 0.20 | | Polyacrylic acid | 7,500 | 0.005 | | | |
| Comparative Example 3 | Polyvinylpyrrolidone | 2,500,000 | 0.03 | 164 | Polyacrylic acid | 4,000 | 0.03 | 1.6 | 9.4 | 1.57 |
| Comparative Example 4 | Polyvinylpyrrolidone | 2,500,000 | 0.20 | 164 | Polyacrylic acid | 7,500 | 0.005 | | 9.1 | |
| Comparative Example 5 | Polyvinylpyrrolidone | 400,000 | 0.03 | 42.1 | Polyacrylic acid | 4,000 | 0.03 | 1.6 | 9.3 | 1.20 |
| Comparative Example 6 | Polyvinylpyrrolidone | 800,000 | 0.03 | 72.1 | Polyacrylic acid | 500 | 0.03 | 1.1 | 9.3 | 1.21 |
| Comparative Example 7 | Polyvinylpyrrolidone | 800,000 | 0.03 | 72.1 | Polyacrylic acid | 13,000 | 0.03 | 3.4 | 9.4 | 1.54 |
| Comparative Example 8 | Polyvinylpyrrolidone | 800,000 | 0.20 | 72.1 | Polymethacrylic acid | 400,000 | 0.1 | | 8.5 | |
| Comparative Example 9 | Polyvinyl alcohol | 150,000 | 0.20 | | Polyacrylic acid | 7,500 | 0.1 | | | |
| Comparative Example 10 | Acrylamide-dimethylaminoethyl-acrylamide copolymer | 650,000 | 0.03 | | Polymethacrylic acid | 8,800 | 0.1 | | 10.1 | |
| Comparative Example 11 | Polyvinylpyrrolidone | 800,000 | 0.03 | 72.1 | — | — | | | 9.1 | 1.26 |
| Comparative Example 12 | — | — | | | Polyacrylic acid | 4,000 | 0.03 | 1.6 | 9.4 | 1.16 |
| Comparative Example 13 | Hydroxyethylcellulose | 1,000,000 | 0.02 | 78.6 | Polymethacrylic acid | 200,000 | 0.03 | 8.9 | 9.4 | 1.40 |
| Comparative Example 14 | — | — | | | Polyphosphoric acid | 8,000 | 0.02 | 2.5 | 9.2 | 1.13 |
| Comparative Example 15 | — | — | | | — | — | | | 9.3 | 1.15 |
| Comparative Example 16 | Polyvinylpyrrolidone | 800,000 | 0.03 | 72.1 | Polyacrylic acid | 4,000 | 0.03 | 1.6 | 5.2 | |

TABLE 2

| | Polishing rate (nm/min) | Endpoint time (s) | Incomplete copper removal | Dishing (nm) | Erosion (nm) | Fang | Scratch |
|---|---|---|---|---|---|---|---|
| Example 1 | 593.2 | 135 | Good | 34.2 | 25.6 | Good | 2 |
| Example 2 | 654.5 | 126 | Good | 26.5 | 12.3 | Good | 1 |
| Example 3 | 613.4 | 142 | Good | 23.1 | 10.1 | Good | 0 |
| Example 4 | 560.5 | 145 | Fair | 15.5 | 8.2 | Good | 17 |
| Example 5 | 760.0 | 109 | Good | 55.5 | 26 | Fair | 4 |
| Example 6 | 580.0 | 128 | Good | 48 | 24.5 | Good | 1 |
| Example 7 | 812.0 | 112 | Good | 47 | 21.5 | Good | 7 |
| Example 8 | 563.0 | 149 | Fair | 37.5 | 16.5 | Good | 11 |
| Example 9 | 513.0 | 139 | Good | 62.5 | 25.5 | Fair | 4 |
| Comparative Example 1 | 575.8 | 134 | Good | 29.8 | 23.3 | Bad | 3 |
| Comparative Example 2 | 492.0 | 157 | Good | 49.5 | 28.5 | Bad | 6 |
| Comparative Example 3 | 553.0 | 182 | Bad | 15.3 | 5.4 | Good | 1 |
| Comparative Example 4 | 425.0 | 171 | Bad | 10.5 | 8.5 | Could not be evaluated | Could not be evaluated |
| Comparative Example 5 | 634.5 | 118 | Good | 35.6 | 24.5 | Bad | 3 |
| Comparative Example 6 | 578.3 | 157 | Bad | 26.0 | 36.9 | Good | 25 |
| Comparative Example 7 | 615.1 | 123 | Good | 45.2 | 40 | Good | 163 |
| Comparative Example 8 | Poor stability | — | Could not be evaluated | Could not be evaluated | Could not be evaluated | Could not be evaluated | Could not be evaluated |
| Comparative Example 9 | 382.0 | 219 | Bad | 12.5 | 6.5 | Could not be evaluated | 12 |
| Comparative Example 10 | 560.0 | 168 | Good | 74.5 | 36.0 | Bad | 191 |
| Comparative Example 11 | 506.4 | 163 | Bad | 27.8 | 20.3 | Good | 1 |
| Comparative Example 12 | 613.5 | 120 | Good | 69.7 | 76.2 | Bad | 34 |
| Comparative Example 13 | 594.1 | 139 | Good | 104.7 | 75.2 | Good | 2 |
| Comparative Example 14 | 646.1 | 197 | Bad | 16.2 | 1.3 | Good | 0 |
| Comparative Example 15 | 590.3 | 136 | Good | 37.7 | 10.4 | Bad | 1 |
| Comparative Example 16 | 476.0 | 176 | Good | 91.5 | 43.5 | Good | 238 |

The invention claimed is:

1. A chemical mechanical polishing aqueous dispersion comprising:
   (A) a first water-soluble polymer having a weight average molecular weight of from 1,500,000 to 2,000,000, a molecule of the first water-soluble polymer comprising a heterocyclic ring;
   (B) a second water-soluble polymer or a salt of the second water-soluble polymer having a weight average molecular weight of 1000 to 10,000 and comprising one group selected from a carboxyl group and a sulfonic group;
   (C) an oxidizing agent; and
   (D) abrasive grains,
   the chemical mechanical polishing aqueous dispersion having a pH of 7 to 12.

2. The chemical mechanical polishing aqueous dispersion as defined in claim 1,
   wherein a mass ratio (A)/(B) of the first water-soluble polymer (A) and the second water-soluble polymer (B) is 0.02 to 50.

3. The chemical mechanical polishing aqueous dispersion as defined in claim 1,
   wherein a 5 mass % aqueous solution of the first water-soluble polymer (A) has a viscosity of 50 to 150 mPa·s.

4. The chemical mechanical polishing aqueous dispersion as defined in claim 1,
   wherein a 5 mass % aqueous solution of the second water-soluble polymer (B) has a viscosity of 1 to 5 mPa·s.

5. The chemical mechanical polishing aqueous dispersion as defined in claim 1,
   wherein the first water-soluble polymer (A) is a copolymer having at least one structural unit derived from a compound selected from vinylpyridine, vinylpyrrolidone, and vinylimidazole.

6. The chemical mechanical polishing aqueous dispersion as defined in claim 1,
   wherein the second water-soluble polymer (B) is a copolymer having at least one structural unit derived from a compound selected from acrylic acid, methacrylic acid, itaconic acid, maleic acid, styrenesulfonic acid, allylsulfonic acid, vinylsulphonic acid, and salts of acrylic acid, methacrylic acid, itaconic acid, maleic acid, styrenesulfonic acid, allylsulfonic acid, and vinylsulphonic acid.

7. The chemical mechanical polishing aqueous dispersion as defined in claim 1, further comprising (E) a complex-forming agent and (F) a surfactant.

8. A chemical mechanical polishing method for a semiconductor device, the method comprising:
   polishing a copper or copper alloy layer on a semiconductor substrate by using the chemical mechanical polishing aqueous dispersion as defined in claim 1.

9. The chemical mechanical polishing aqueous dispersion of claim 1, wherein the first water-soluble polymer is a polyvinyl pyrrolidone, and the second water-soluble polymer is at least one of a polymethacrylic acid and a polyacrylic acid.

10. The chemical mechanical polishing aqueous dispersion of claim 1, wherein the first water-soluble polymer is present in a concentration of from 0.15 to 0.01 mass %.

11. The chemical mechanical polishing aqueous dispersion of claim 10, wherein the second water-soluble polymer has a weight average molecular weight of from 1,600 to 10,000 and is present in a concentration of from 0.01 to 0.80 mass %.

12. The chemical mechanical polishing aqueous dispersion of claim 1, having a pH of from 8.2 to 10.5.

13. The chemical mechanical polishing aqueous dispersion of claim 1, wherein the first water-soluble polymer has a viscosity of 60.5-86.4 MPa·s as a 5 mass % aqueous solution.

14. The chemical mechanical polishing aqueous dispersion of claim 1, wherein the second water-soluble polymer has a viscosity of 1.6 to 2.0 MPa·s as a 5 mass % aqueous solution.

* * * * *